US009666306B2

(12) United States Patent
Mochida

(10) Patent No.: US 9,666,306 B2
(45) Date of Patent: *May 30, 2017

(54) SEMICONDUCTOR DEVICE HAVING HIERARCHICALLY STRUCTURED BIT LINES

(71) Applicant: PS4 Luxco S.a.r.l., Luxembourg (LU)

(72) Inventor: Noriaki Mochida, Tokyo (JP)

(73) Assignee: Longitude Semiconductor S.a.r.l., Luxembourg (LU)

(*) Notice: Subject to any disclaimer, the term of this patent is extended or adjusted under 35 U.S.C. 154(b) by 0 days.

This patent is subject to a terminal disclaimer.

(21) Appl. No.: 14/992,645

(22) Filed: Jan. 11, 2016

(65) Prior Publication Data

US 2016/0125961 A1     May 5, 2016

Related U.S. Application Data

(63) Continuation of application No. 13/964,782, filed on Aug. 12, 2013, now Pat. No. 9,236,149.

(30) Foreign Application Priority Data

Aug. 14, 2012 (JP) ................. 2012-179906

(51) Int. Cl.
*G11C 29/00* (2006.01)
*G11C 5/06* (2006.01)
*G11C 11/4097* (2006.01)

(52) U.S. Cl.
CPC ........... *G11C 29/76* (2013.01); *G11C 5/06* (2013.01); *G11C 29/808* (2013.01); *G11C 11/4097* (2013.01)

(58) Field of Classification Search
CPC ..... G11C 7/18; G11C 11/4097; G11C 29/808; G11C 29/81
USPC ..................................... 365/63, 200
See application file for complete search history.

(56) References Cited

U.S. PATENT DOCUMENTS

| 7,940,583 B2 * | 5/2011 | Riho ............... G11C 8/08 365/189.04 |
| 9,236,149 B2 * | 1/2016 | Mochida ........... G11C 29/76 |
| 2011/0026348 A1 * | 2/2011 | Narui ............... G11C 7/227 365/210.1 |

* cited by examiner

*Primary Examiner* — Tri Hoang

(57) ABSTRACT

Disclosed herein is a device includes first and second memory mats. The first memory mat includes first and defective memory cells and first local bit lines coupled to a first global bit line. Each of the first local bit lines is coupled to associated ones of the first memory cells, one of the first local bit lines is further coupled to the defective memory cell. The second memory mat includes second and redundant memory cells and second local bit lines coupled to a second global bit line. Each of the second local bit lines is coupled to associated ones of the second memory cells, one of the second local bit lines is further coupled to the redundant memory cell. The device further includes a control circuit accessing the redundant memory cell when the access address information coincides with the defective address information that designates the defective memory cell.

10 Claims, 16 Drawing Sheets

SEMICONDUCTOR DEVICE HAVING HIERARCHICALLY STRUCTURED BIT LINES

CONTINUING DATA

This application is a continuation of U.S. patent application Ser. No. 13/964,782, filed Aug. 12, 2013, entitled "Semiconductor Device Having Hierarchically Structured Bit Lines," now U.S. Pat. No. 9,236,149, issued Jan. 12, 2016, which claims the benefit of priority from Japanese Patent Application No. 2012-179906, filed on Aug. 14, 2012, the contents of which are incorporated herein by reference.

BACKGROUND OF THE INVENTION

Field of the Invention

The present invention relates to a semiconductor device, and more particularly relates to a semiconductor device in which bit lines are hierarchically structured.

Description of Related Art

In some of semiconductor devices represented by a DRAM (Dynamic Random Access Memory), bits lines are hierarchically structured into local bit lines and global bit lines (see Japanese Patent Application Laid-open No. H8-195100 and Japanese Patent Application Laid-open No. 2011-34614). The local bit lines are low-order bit lines and are connected to memory cells. The global bit lines are high-order bit lines and are connected to sense amplifiers. When the bit lines are hierarchically structured, the number of memory cells that are allocated to one sense amplifier can be increased while the wiring length of the local bit lines having relatively-high electrical resistances can be shortened.

However, in the conventional semiconductor device having hierarchically structured bit lines, when a defective word line is to be replaced with a redundant word line, the redundant word line must be selected among redundant word lines that intersect with the same local bit line that intersects the defective word line. That is, the defective word line can be replaced only within a memory sub-mat in which the local bit line extends and thus its relieving efficiency is low.

SUMMARY

In one embodiment, there is provided a device that includes: a first memory mat including; a plurality of first memory cells, a defective memory cell, a first global bit line, and a plurality of first local bit lines coupled in common to the first global bit line, each of the first local bit lines coupled to associated ones of the first memory cells, one of the first local bit lines being further coupled to the defective memory cell, second memory mat including; a plurality of second memory cells, a redundant memory cell, a second global bit line, and a plurality of second local bit lines coupled in common to the second global bit line, each of the second local bit lines coupled to associated ones of the second memory cells, one of the second local bit lines being further coupled to the redundant memory cell, a plurality of terminals receiving access address information, and a control circuit including a storing unit that is configured to store defective address information that designate the defective memory cell of the first memory mat and accessing unit that is configured to access to the redundant memory cell of the second memory mat when the access address information coincide with the defective address information.

In another embodiment, there is provided a device that includes: first, second, third and fourth global bit lines; a first sense amplifier that amplifies a potential difference between the first and fourth global bit lines; a second sense amplifier that amplifies a potential difference between the second and third global bit lines; a plurality of first local bit lines; a plurality of second local bit lines; a plurality of third local bit lines; a plurality of fourth local bit lines; a plurality of first hierarchy switches each connected between the first global bit line and an associated one of the first local bit lines; a plurality of second hierarchy switches each connected between the second global bit line and an associated one of the second local bit lines; a plurality of third hierarchy switches each connected between the third global bit line and an associated one of the third local bit lines; a plurality of fourth hierarchy switches each connected between the fourth global bit line and an associated one of the fourth local bit lines; a plurality of first word lines each intersecting with an associated one of the first local bit lines, the first word lines including a defective word line; a plurality of second word lines each intersecting with an associated one of the second local bit lines, the second word lines including a redundant word line; a plurality of third word lines each intersecting with an associated one of the third local bit lines; a plurality of fourth word lines each intersecting with an associated one of the fourth local bit lines; a plurality of first memory cells each arranged at an associated one of intersections of the first word lines and the first local bit lines; a plurality of second memory cells each arranged at an associated one of intersections of the second word lines and the second local bit lines; a plurality of third memory cells each arranged at an associated one of intersections of the third word lines and the third local bit lines; a plurality of fourth memory cells each arranged at an associated one of intersections of the fourth word lines and the fourth local bit lines; and a control circuit that activates the redundant word line, brings one of the second hierarchy switches that is connected to one of the second local bit lines intersecting with the redundant word line into conductive state, and further activates the second sense amplifier, in response to an access request to the defective word line.

In still another embodiment, there is provided a device that includes: a first memory mat including; a plurality of first word lines, a defective word line, first and second global bit lines, a plurality of first local bit lines coupled in common to the first global bit line, each of the first local bit lines crossing associated ones of the first word lines, one of the first local bit lines further crossing the defective word line, a plurality of second local bit lines coupled in common to the second global bit line, each of the second local bit lines crossing associated ones of the first word lines, one of the second local bit lines further crossing the defective word line, a plurality of first memory cells each coupled to an associated one of the first and defective word lines and coupled to an associated one of the first and second local bit lines, a second memory mat including: a plurality of second word lines, a redundant word line, third and fourth global bit lines, a plurality of third local bit lines coupled in common to the third global bit line, each of the third local bit lines crossing associated ones of the second word lines, one of the third local bit lines further crossing the redundant word line, a plurality of fourth local bit lines coupled in common to the fourth global bit line, each of the fourth local bit lines crossing associated ones of the second word lines, one of the fourth local bit lines further crossing the redundant word line, a plurality of second memory cells each coupled to an associated one of the second and redundant word lines and coupled to an associated one of the third and fourth local bit lines, a plurality of terminals receiving access address information, and a control circuit including a storing unit that is configured to store defective address information that designate the defective word line of the first memory mat and accessing unit that is configured to access to ones of the second memory cells coupled to the redundant word line of the second memory mat when the access address information coincide with the defective address information.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
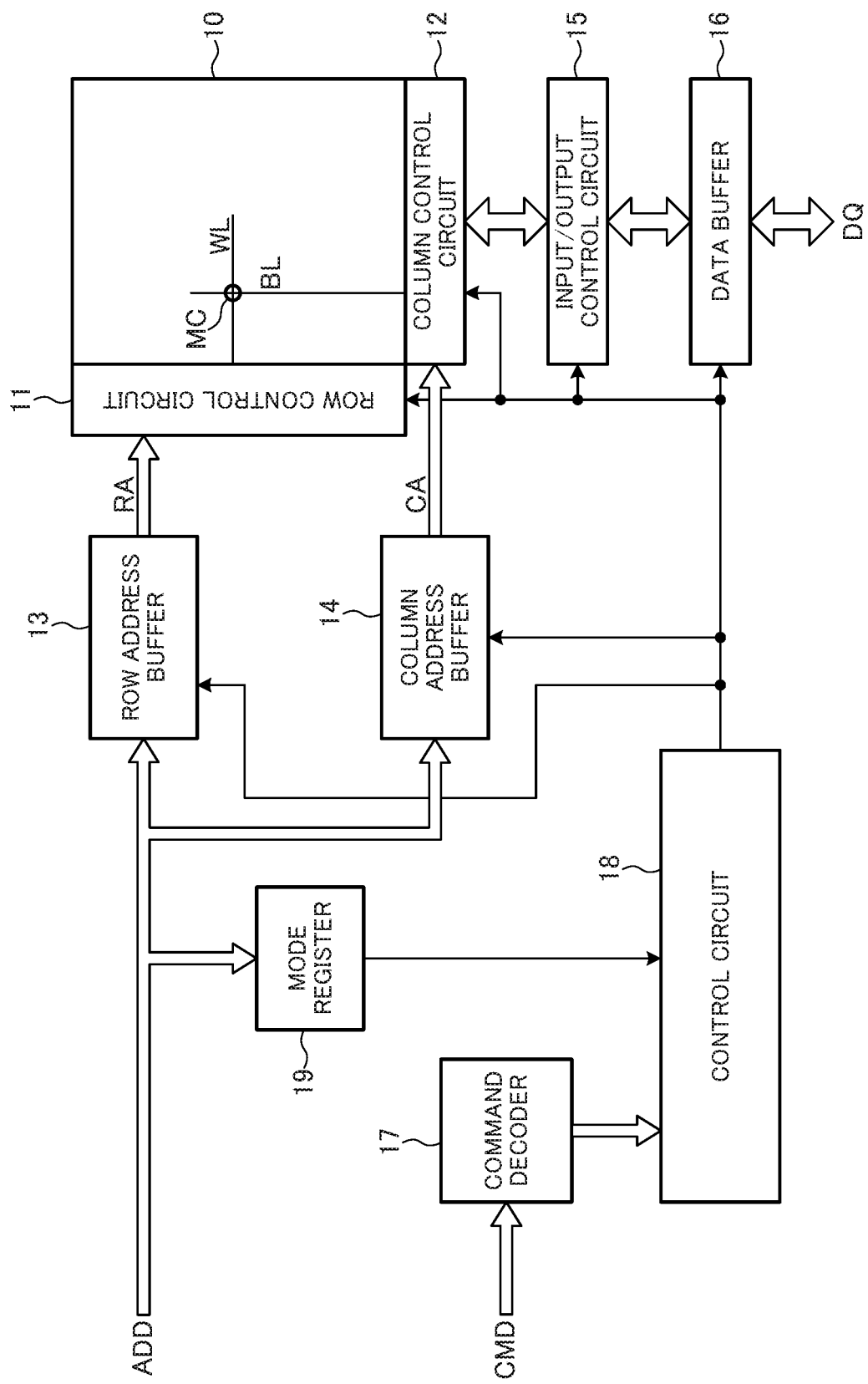
FIG. 1 is a block diagram showing a configuration of a semiconductor device according to an embodiment of the present invention.

Referring now to FIG. 1, the semiconductor device according to the present embodiment is a DRAM and includes a memory cell array area 10. In the memory cell array area 10, main-word lines and sub-word lines that are hierarchically structured and global bit lines and local bit lines that are hierarchically structured are provided. A memory cell is arranged at each of intersections of the sub-word lines and the local bit lines. Details of the memory cell array area 10 are explained later. Selection of a main-word line or a sub-word line is performed by a row control circuit 11 and selection of a global bit line or a local bit line is performed by a column control circuit 12. Hierarchy switches explained later are each connected between one of the global bit lines and one of the local bit lines and a control of the hierarchy switches is performed also by the row control circuit 11.

A row address RA is supplied to the row control circuit 11 by a row address buffer 13. A column address CA is supplied to the column control circuit 12 by a column address buffer 14. The row address RA and the column address CA are both an address signal ADD supplied from outside and whether the address signal ADD is input to the row address buffer 13 or the column address buffer 14 is controlled by a control circuit 18. The control circuit 18 controls various functional blocks based on an output from a command decoder 17 that decodes an external command CMD. Specifically, when the external command CMD indicates an active command, the address signal ADD is supplied to the row address buffer 13. When the external command CMD indicates a read command or a write command, the address signal ADD is supplied to the column address buffer 14.

Accordingly, when the active command and the read command are issued in this order and a row address RA and a column address CA are input synchronously therewith, data DQ can be read from a memory cell designated by these addresses. When the active command and the write command are issued in this order and a row address RA and a column address CA are input synchronously therewith, data DQ can be written in a memory cell designated by these addresses. Read and write operations of the data DQ is performed via an input-output control circuit 15 and a data buffer 16.

The semiconductor device according to the present embodiment further includes a mode register 19 and a set value in the mode register 19 is supplied to the control circuit 18. A parameter indicating an operation mode of the semiconductor device according to the present embodiment is set in the mode register 19.

Figure 2:
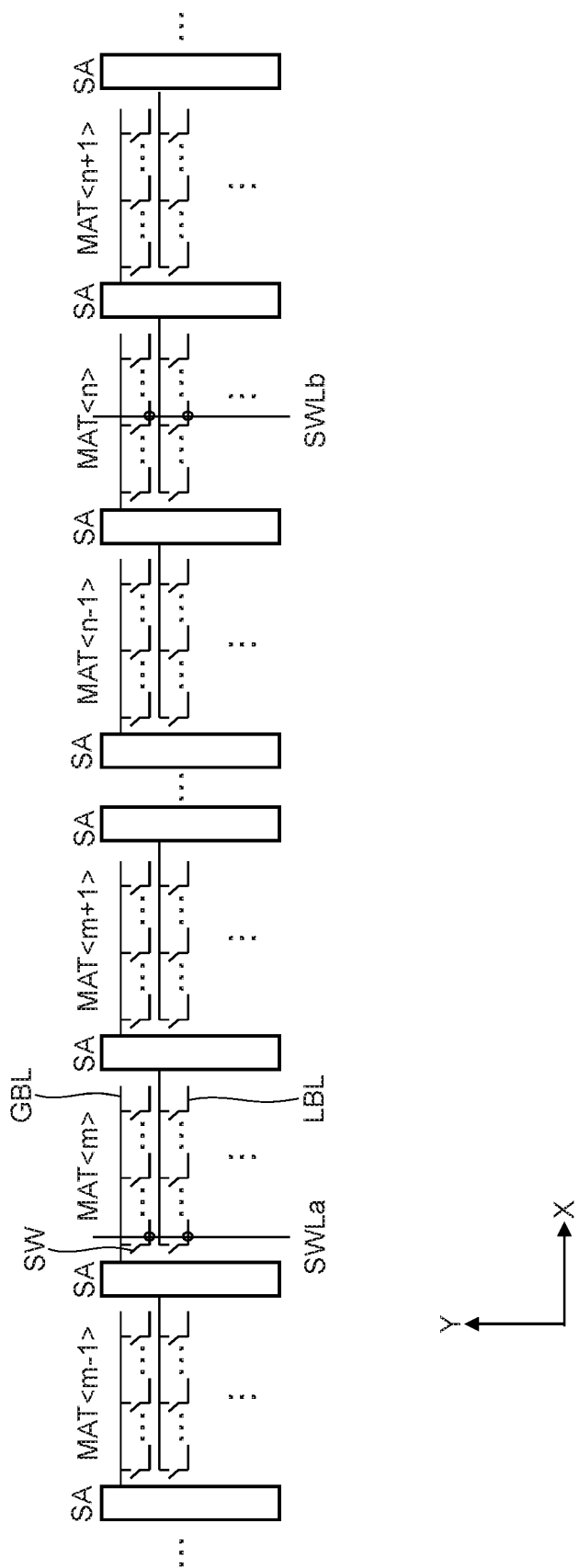
FIG. 2 is a schematic circuit diagram for explaining an internal structure of a memory cell array area shown in FIG. 1.

Turning to FIG. 2, the memory cell array area 10 includes a plurality of memory mats MAT. Among these, only memory mats MAT<m−1> to MAT<m+1> and MAT<n−1> to MAT<n+1> are shown in FIG. 2. A sense amplifier SA is arranged between two memory mats adjacent to each other in an X direction. Each of the sense amplifiers SA is connected to a global bit line GBL in a memory mat located on one side in the X direction and to a global bit line GBL in a memory mat located on the other side in the X direction and amplifies a potential difference occurring between these global bit lines GBL. While the semiconductor device according to the present embodiment has a so-called "open bit-line structure", the present invention is not limited thereto.

A plurality of local bit lines LBL are connected to each of the global bit lines GBL via corresponding hierarchy switches SW, respectively. A plurality of memory cells MC are connected to each of the local bit lines LBL and selection of a memory cell MC is performed by using a sub-word line SWL. Therefore, when data is to be read from a given memory cell MC, the corresponding sub-word line SWL is activated and also the corresponding hierarchy switch SW is brought into conductive state, thereby transferring the data read to the corresponding local bit line LBL to the corresponding global bit line GBL. The data transferred to the global bit line GBL is amplified by the corresponding sense amplifier SA, thereby reading the data from the memory cell MC.

When there is a defect in one of the sub-word lines SWL, the defective sub-word line SWL is replaced with a redundant sub-word line SWL to relieve the corresponding address. In this case, the defective sub-word line is not only a sub-word line having a defect in itself but also a sub-word line having one or more of memory cells connected thereto having a defect.

In the semiconductor device according to the present embodiment, the redundant sub-word line SWL can belong to a memory sub-mat or a memory mat different from that to which the defective sub-word line SWL belongs. The memory sub-mat indicates a range in which one local bit line LBL extends. In an example shown in FIG. 2, when a sub-word line SWLa allocated to the memory mat MAT<m> is defective, the sub-word line SWLa is replaced with a redundant sub-word line SWLb allocated to the memory mat MAT<n>.

In this way, in the present embodiment, a redundant sub-word line SWL belonging to a different memory mat can be selected as a replacement of a defective sub-word line SWL. Accordingly, it is unnecessary to provide a redundant sub-word line SWL in each memory sub-mat and relieving efficiency can be enhanced. To perform this control, when an access to a defective sub-word line SWL is requested, switching of hierarchy switches SW to be brought into conduction and of sense amplifiers SA to be activated needs to be performed as explained below.

Figure 3:
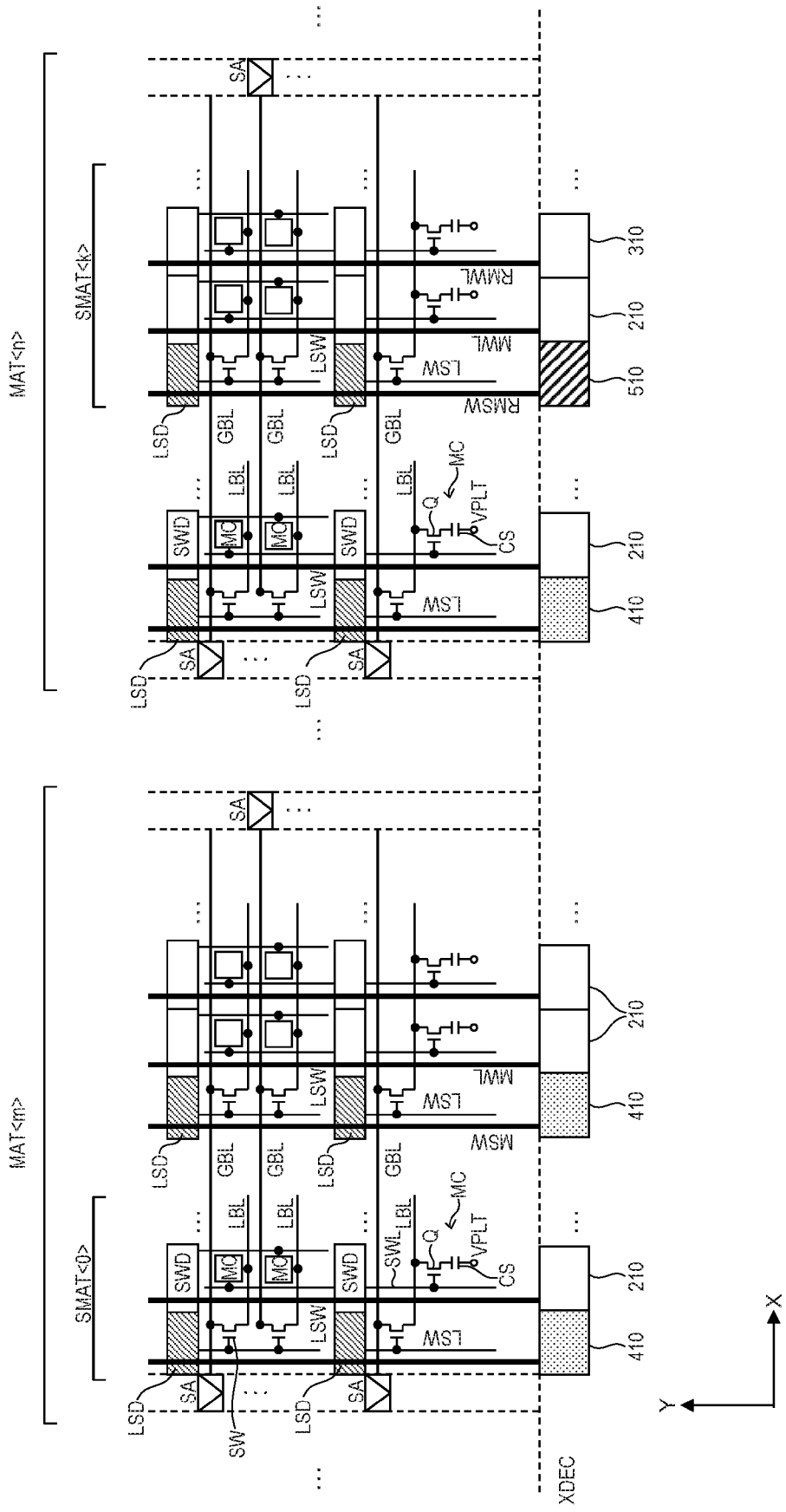
FIG. 3 is a circuit diagram for explaining structures of memory mats MAT<m> and MAT<n> shown in FIG. 2.

Turning to FIG. 3, a plurality of global bit lines GBL and a plurality of local bit lines LBL extending in the X direction are provided in each memory mat. The global bit lines GBL are ranked into a higher level and are connected to the sense amplifiers SA. The local bit lines LBL are ranked into a lower level and are connected to the memory cells MC. Each of the hierarchy switches SW is connected between one of the global bit lines GBL and one of the local bit lines LBL.

Each of the sense amplifiers SA is a circuit that amplifies a potential difference appearing between paired global bit lines GBL and an operation timing thereof is controlled by sense-amplifier drive signals (RSAPT and RSANT) output from the row control circuit 11 shown in FIG. 1. Although not shown in FIG. 3, each of the sense amplifiers SA includes an equalizer circuit that equalizes potentials of the corresponding paired global bit lines GBL. An operation of the equalizer circuit is controlled by an equalizing signal (BLEQB) explained later. The equalizing signal (BLEQB) is also generated by the row control circuit 11.

As shown in FIG. 3, a plurality of local bit lines LBL are allocated to each of the global bit lines GBL. Accordingly, many memory cells MC can be allocated to one sense amplifier SA and thus the number of sense amplifiers SA can be reduced. Each of the local bit lines LBL is connected to the global bit line GBL via the corresponding hierarchy switch SW. The hierarchy switches SW each include an N-channel MOS transistor having a gate electrode connected to a corresponding local control signal line LSW. Each of the local control signal lines LSW extends in a Y direction and is driven by corresponding one of local switch drivers LSD.

Because the semiconductor device according to the present embodiment is a DRAM as mentioned above, each of the memory cells MC includes a series circuit of a cell transistor Q and a cell capacitor CS. The cell transistor Q includes an N-channel MOS transistor having one end connected to the corresponding local bit line LBL and the other end connected to one end of the cell capacitor CS. A plate potential VPLT is supplied to the other end of the cell capacitor CS. The cell transistor Q has a gate electrode connected to the corresponding sub-word line SWL. In the present invention, the sub-word line SWL is also simply referred to as "word line". The sub-word line SWL extends in the Y direction and is driven by corresponding one of sub-word drivers SWD.

With this configuration, when any of the sub-word lines SWL is activated, the corresponding cell transistor Q is turned on, which connects the cell capacitor CS to the corresponding local bit line LBL. Therefore, data stored in the cell capacitor CS is read to the local bit line LBL. In the present invention, the cell capacitor CS is also simply referred to as "memory element". It is not essential in the present invention that the memory element is constituted by a cell capacitor and other types of memory elements can be used. Furthermore, it is not essential in the present invention that the cell transistor Q is constituted by an N-channel MOS transistor. Other elements or circuits including a plurality of elements can be also used therefor. In any case, a control terminal of the cell transistor Q (the gate electrode in the case of the MOS transistor) is connected to the corresponding sub-word line SWL.

A main-word line MWL extending in the Y direction is connected to corresponding ones of the sub-word drivers SWD and the sub-word drivers SWD are activated based on a main-word signal (MWLB) supplied through the main-word line MWL. The main-word signal (MWLB) is generated based on a high-order bit of a row address RA and activated ones of the sub-word drivers SWD select any of the sub-word lines SWL based on a low-order bit of the row address RA. The main-word signals (MWLB) are generated by corresponding driver circuits 210, respectively. The driver circuits 210 correspond to a circuit block (a main-word driver 200) included in the row control circuit 11 shown in FIG. 1.

A main control signal line MSW extending in the Y direction is connected to corresponding ones of the local switch drivers LSD and the local switch drivers LSD are activated based on a main control signal (MSWB) supplied through the main control signal line MSW. The main control signal (MSWB) is also generated based on a high-order bit of a row address RA and activated ones of the local switch drivers LSD turn on the corresponding hierarchy switches SW. The main control signals (MSWB) are generated by corresponding driver circuits 410, respectively. The driver circuits 410 correspond to a circuit block (a main switch driver 400) included in the row control circuit 11 shown in FIG. 1.

As shown in FIG. 3, a range in which one local bit line LBL extends within a memory mat is a memory sub-mat. A memory sub-mat SMAT<0> in the memory mat MAT<m> and a memory sub-mat SMAT<k> in the memory mat MAT<n> are shown in FIG. 3. The memory sub-mat SMAT<0> in the memory mat MAT<m> includes the sub-word line SWLa shown in FIG. 2 and the memory sub-mat SMAT<k> in the memory mat MAT<n> includes the sub-word line SWLb shown in FIG. 2.

A redundant main-word line RMWL and a redundant main control signal line RMSW extending in the Y direction are connected to the memory sub-mat SMAT<k> in the memory mat MAT<n>. The redundant main-word line RMWL and the redundant main control signal line RMSW are driven by redundant driver circuits 310 and 510, respectively. The redundant main-word line RMWL and the redundant main control signal line RMSW are activated when a replacement operation is performed.

A circuit configuration of the row control circuit 11 is explained next in detail.

Figure 4:
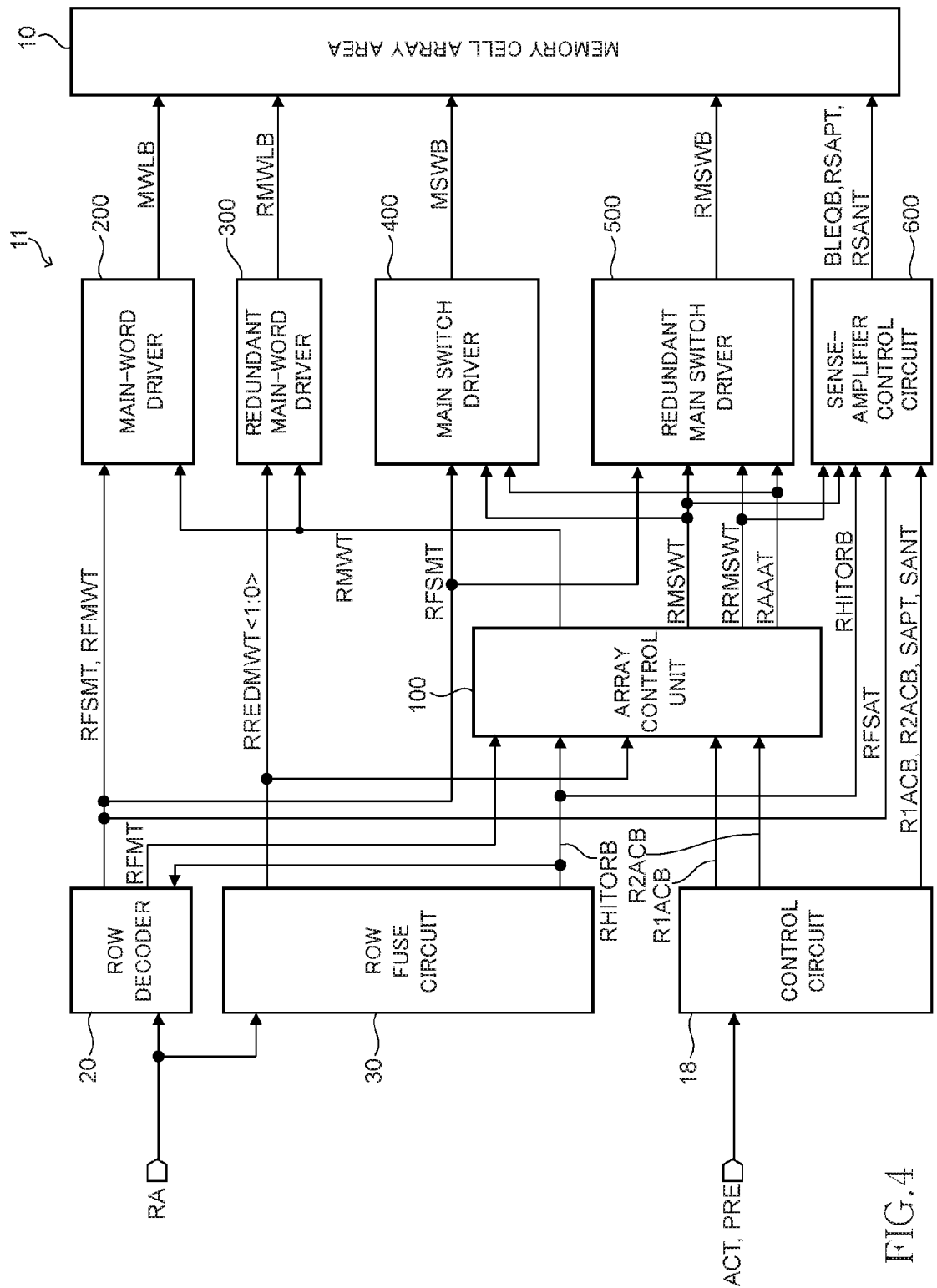
FIG. 4 is a block diagram showing a circuit configuration of the a row control circuit 11 shown in FIG. 1 according to a first embodiment of the present invention.

Turning to FIG. 4, the row control circuit 11 includes a row decoder 20 and a row fuse circuit 30 that receive a row address RA. The row decoder 20 decodes a row address RA to generate predecode signals RFSMT, RFMWT, RFMT, and RFSAT. The predecode signal RFSMT is supplied to the main-word driver 200, the main switch driver 400, and a redundant main switch driver 500. The predecode signal RFMWT is supplied to the main-word driver 200. The predecode signal RFMT is supplied to an array control unit 100. The predecode signal RFSAT is supplied to a sense-amplifier control circuit 600. The row decoder 20 deactivates the predecode signals RFSMT and RFMWT and converts the predecode signals RFMT and RFSAT to a signal indicating a replacement according to a hit signal RHITORB generated by the row fuse circuit 30.

The row fuse circuit 30 determines whether a row address RA to which an access is requested indicates a defective sub-word line SWL. As a result of determination, when it is determined that the row address RA to which an access is requested indicates a defective sub-word line SWL (when it is determined as a hit), the hit signal RHITORB is activated and a replacement address signal RREDMWT indicating a replacement is generated. The hit signal RHITORB is supplied to the row decoder 20, the array control unit 100, and the sense-amplifier control circuit 600. The replacement address signal RREDMWT is supplied to the array control unit 100 and a redundant main-word driver 300. The row fuse circuit 30 includes a plurality of fuse elements (not shown) and addresses of defective sub-word lines SWL are stored in these fuse elements in a nonvolatile manner.

In addition to the signals above mentioned, timing signals R1ACB and R2ACB are also supplied to the array control unit 100 from the control circuit 18. The control circuit 18 generates timing signals R1ACB, R2ACB, SAPT, and SANT based on internal commands ACT and PRE supplied from the command decoder 17 shown in FIG. 1. The internal command ACT is activated when an active command is issued from outside, and the internal command PRE is activated when a precharge command is issued from outside. The active command is issued at the time of a row access, that is, at the time of inputting a row address RA. The precharge command is issued at the time of a precharge operation, that is, when the global bit lines GBL are to be equalized.

The array control unit 100 receives the signals mentioned above and generates various kinds of control signals RMWT, RMSWT, RRMSWT, and RAAAT. Among these signals, the control signal RMWT is supplied to the main-word driver 200 and the redundant main-word driver 300. The control signal RMSWT is supplied to the main switch driver 400, the redundant main switch driver 500, and the sense-amplifier control circuit 600. The control signal RRMSWT is supplied to the redundant main switch driver 500 and the sense-amplifier control circuit 600. The control signal RAAAT is supplied to the main switch driver 400 and the redundant main switch driver 500.

Figure 5:
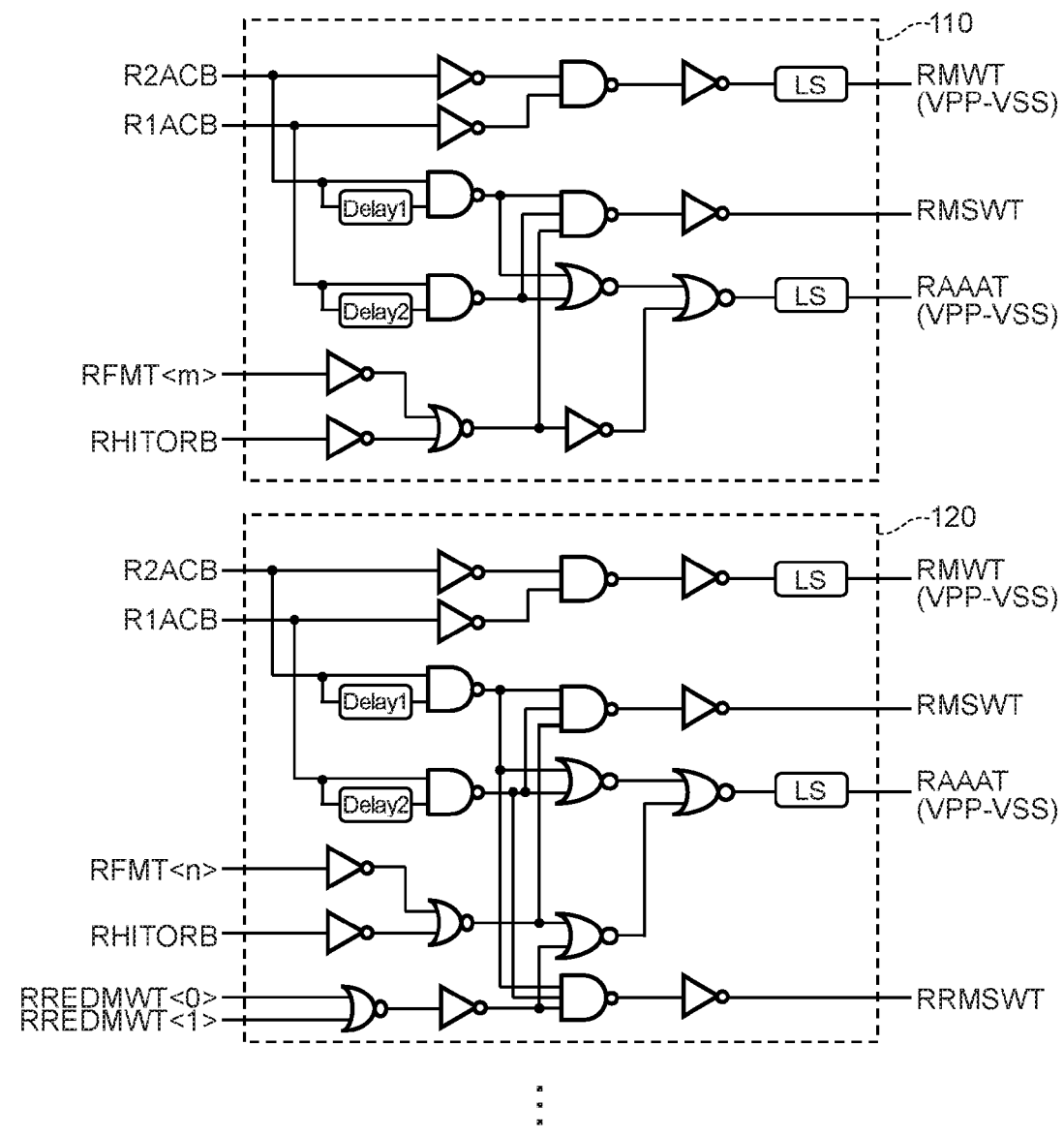
FIG. 5 is a circuit diagram of an array control unit shown in FIG. 4.

Turning to FIG. 5, the array control unit 100 includes a plurality of logic circuit units 110, 120, . . . . The logic circuit unit 110 generates the control signals RMWT, RMSWT, and RAAAT based on a corresponding predecode signal RFMT<m>, and the logic circuit unit 120 generates the control signals RMWT. RMSWT, RRMSWT, and RAAAT based on a corresponding predecode signal RFMT<n>.

To explain more specifically, the logic circuit unit 110 activates the control signals RMWT and RMSWT synchronously with the timing signals R1ACB and R2ACB when the predecode signal RFMT<m> and the hit signal RHITORB are both at a high level. Similarly, the logic circuit unit 120 activates the control signals RMWT and RMSWT synchronously with the timing signals R1ACB and R2ACB when the predecode signal RFMT<n> and the hit signal RHITORB are both at a high level.

Alternatively, when the hit signal RHITORB is activated at a low level, the logic circuit unit 110 keeps the control signals RMSWT and RAAAT deactivated. Meanwhile, the logic circuit unit 120 activates the control signal RRMSWT, instead of the control signal RMSWT, in response to a replacement address signal RREDMWT<0> or <1> when the hit signal RHITORB is activated at a low level.

In FIG. 5, (VPP-VSS) is attached to a signal name, which indicates that the signal has an amplitude from a boosted potential VPP to a ground potential VSS. The amplitude is increased by a level shift circuit LS.

Figure 6:
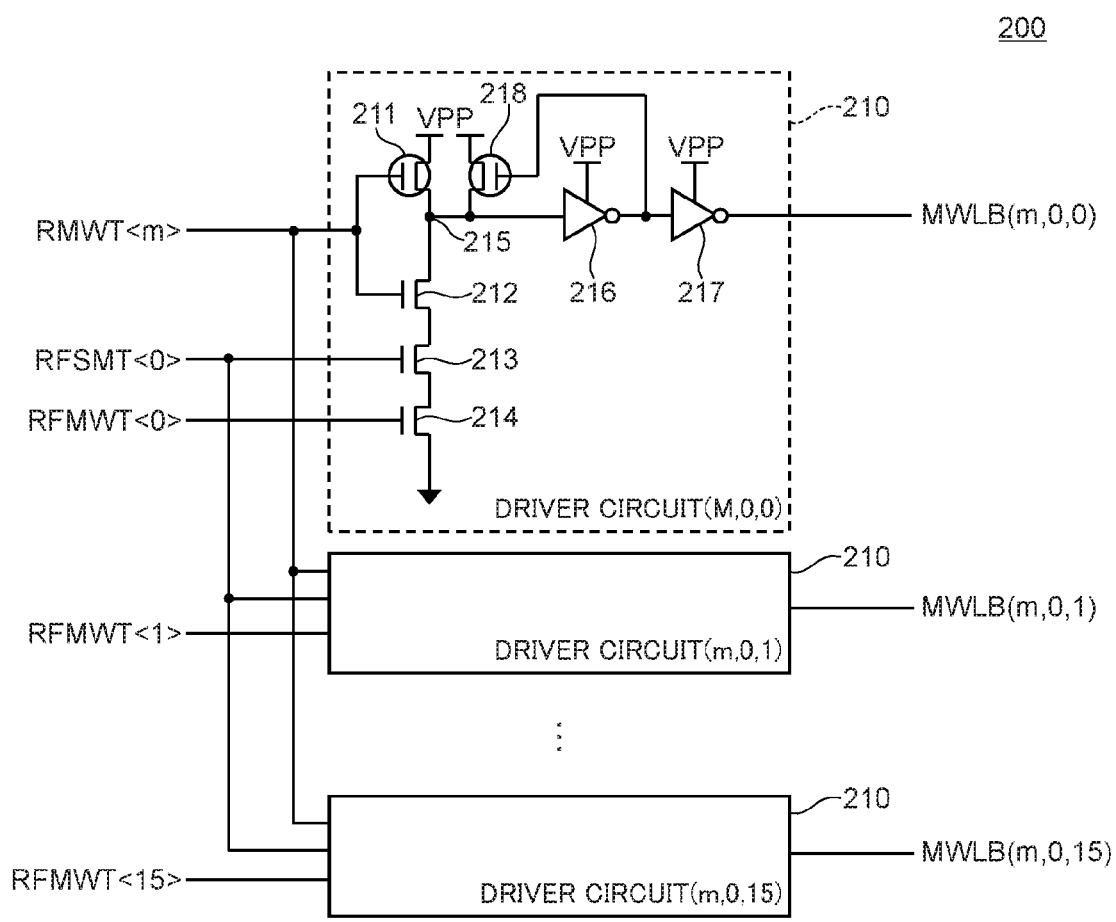
FIG. 6 is a circuit diagram of a main-word driver shown in FIG. 4.

Turning to FIG. 6, the main-word driver 200 includes a plurality of the driver circuits 210. Corresponding ones of the predecode signals RFSMT and RFMWT and corresponding one of the control signal RMWT are input to each of the driver circuits 210, and when these signals are all activated, the main-word signal MWLB output from the corresponding driver circuit 210 is activated to a low level. More specifically, each of the driver circuits 210 includes transistors 211 to 214 connected between the boosted potential VPP and the ground potential VSS. The corresponding control signal RMWT is input to gate electrodes of the transistors 211 and 212, and the corresponding predecode signals RFSMT and RFMWT are input to gate electrodes of the transistors 213 and 214, respectively. With this configuration, when these signals all have a high level, a node 215 has a low level and thus the corresponding main-word signal MWLB is set to a low level through inverters 216 and 217.

When at least one of these signals has a low level, at least one of the transistors 212 to 214 is turned off and thus the node 215 is kept precharged at a high level. Accordingly, the corresponding main-word signal MWLB is deactivated at a high level. This state is kept by a feedback loop including the inverter 216 and a transistor 218.

Combinations of the predecode signals RFSMT and RFMWT and the control signal RMWT to be input to the driver circuits 210, respectively, differ according to the driver circuits 210. Therefore, for example, when predecode signals RFSMT<0> and RFMWT<0> and a control signal RMWT<m> are activated, a main-word signal MWLB(m, 0, 0) is activated.

Figure 7:
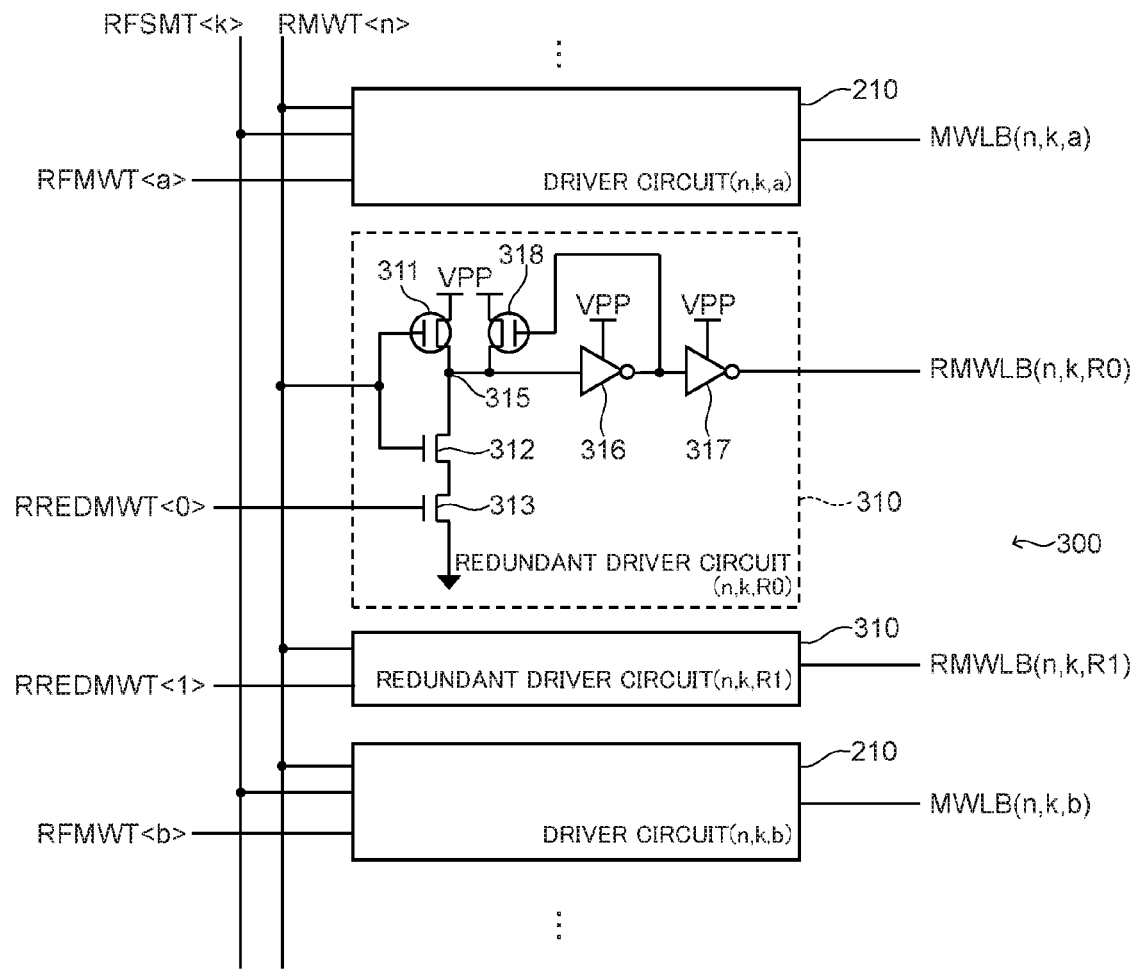
FIG. 7 is a circuit diagram of a redundant main-word driver shown in FIG. 4.

Turning to FIG. 7, the redundant main-word driver 300 includes a plurality of redundant driver circuits 310. Corresponding one of the replacement address signals RREDMWT and corresponding one of the control signals RMWT are input to each of the redundant driver circuits 310, and when these signals are all activated, a redundant main-word signal RMWLB output from corresponding one of the redundant driver circuits 310 is activated to a low level. More specifically, each of the redundant driver circuits 310 includes transistors 311 to 313 connected between the boosted potential VPP and the ground potential VSS. The corresponding control signal RMWT is input to gate electrodes of the transistors 311 and 312 and the corresponding replacement address signal RREDMWT is input to a gate electrode of the transistor 313. With this configuration, when these signals all have a high level, a node 315 has a low level and thus the corresponding redundant main-word signal RMWLB is set to a low level through inverters 316 and 317.

Meanwhile, when at least one of these signals has a low level, at least one of the transistors 312 and 313 is turned off and thus the node 315 is kept precharged at a high level. Accordingly, the corresponding redundant main-word signal RMWLB is deactivated at a high level. This state is kept by a feedback loop including the inverter 316 and a transistor 318.

Combinations of the replacement address signal RREDMWT and the control signal RMWT to be input to the redundant driver circuits 310, respectively, differ according to the redundant driver circuits 310. Therefore, for example, when a replacement address signal RREDMWT<0> and a control signal RMWT<n> are activated, a redundant main-word signal RMWLB(n, k, R0) is activated. In this case, k denotes a sub-mat number of the corresponding memory sub-mat SMAT (see FIG. 3). The redundant driver circuits 310 allocated to the memory sub-mat SMAT<k> are interposed between the driver circuits 210 to which a predecode signal RFSMT<k> is input as shown in FIG. 7.

Figure 8:
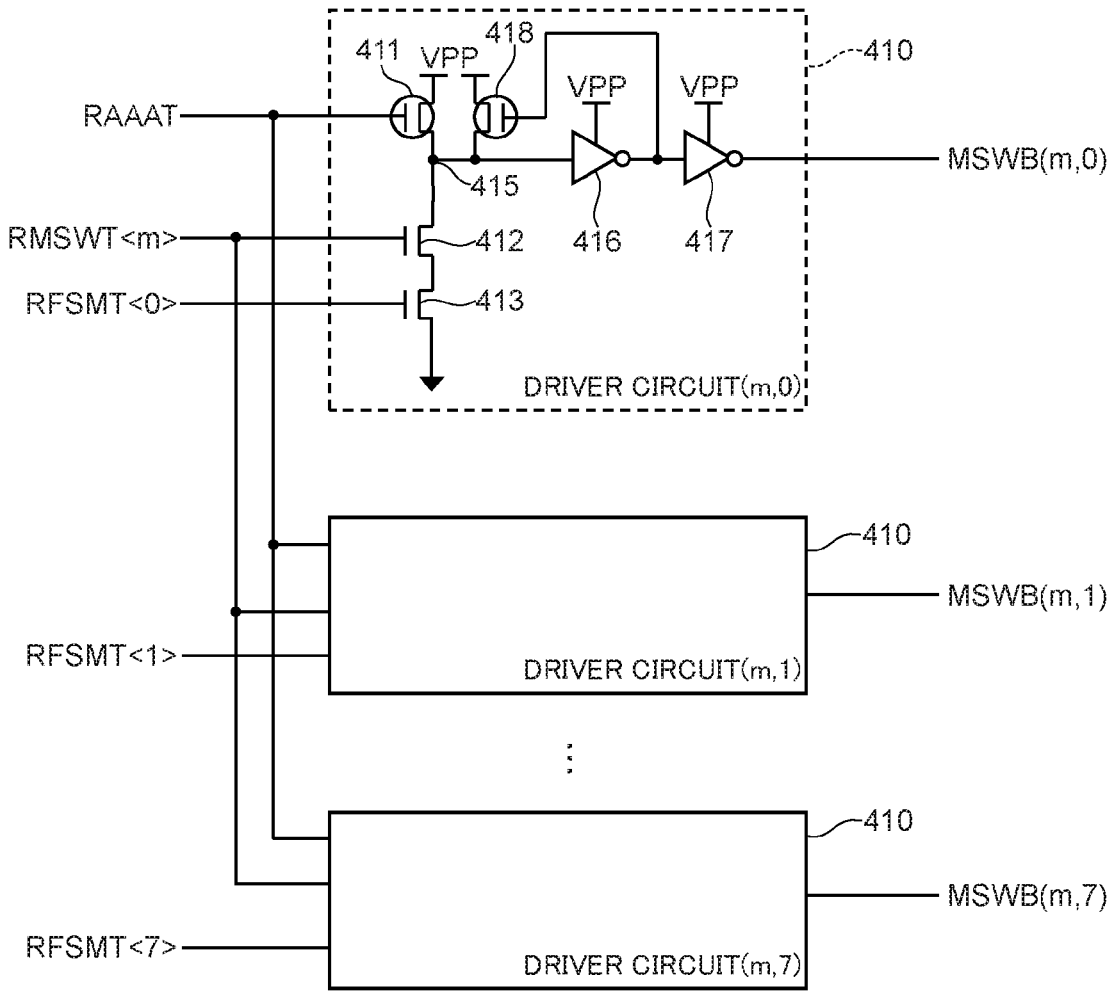
FIG. 8 is a circuit diagram of a main switch driver shown in FIG. 4.

Turning to FIG. 8, the main switch driver 400 includes a plurality of the driver circuits 410. Each of the driver circuits 410 has the same circuit configuration as that of the driver circuits 210. When corresponding one of the predecode signals RFSMT and corresponding ones of the control signals RMSWT and RAAAT are all activated, the main control signal MSWB output from the corresponding driver circuit 410 is activated to a low level. More specifically, each of the driver circuits 410 includes transistors 411 to 413 connected between the boosted potential VPP and the ground potential VSS and the corresponding control signals RAAAT and RMSWT and the corresponding predecode signal RFSMT are input to gate electrodes of the transistors 411 to 413, respectively. With this configuration, when these signals all have a high level, a node 415 has a low level and thus the corresponding main control signal MSWB is set to a low level through inverters 416 and 417.

Meanwhile, when at least one of these signals has a low level, the transistor 411 is turned on or at least one of the transistors 412 and 413 is turned off and thus the node 415 is kept precharged at a high level. Accordingly, the corresponding main control signal MSWB is deactivated to a high level. This state is kept by a feedback loop including the inverter 416 and a transistor 418.

Combinations of the predecode signal RFSMT and the control signal RMSWT to be input to the driver circuits 410, respectively, differ according to the driver circuits 410. Therefore, for example, when a predecode signal RFSMT<0> and a control signal RMSWT<m> are activated, a main control signal MSWB(m, 0) is activated.

Figure 9:
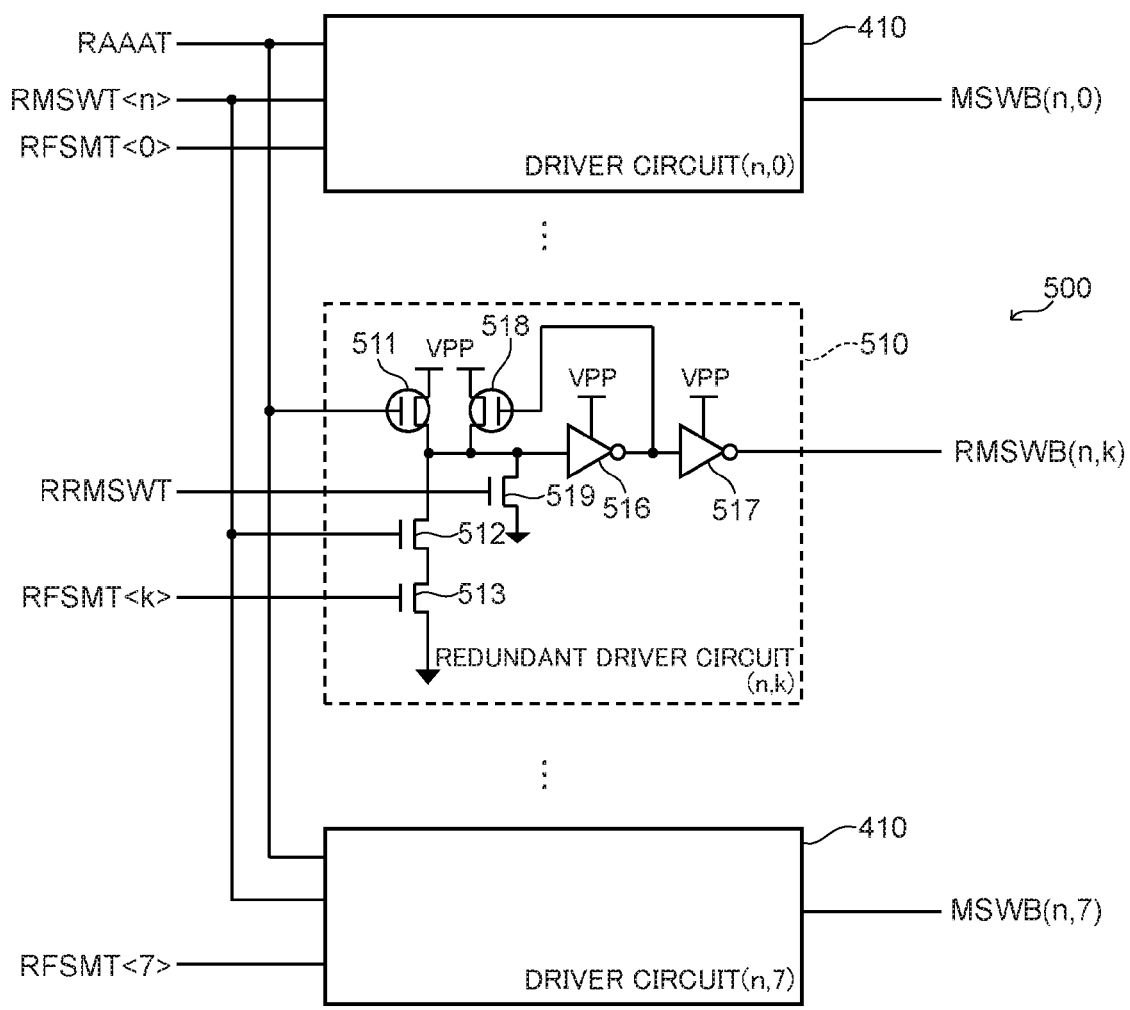
FIG. 9 is a circuit diagram of a redundant main switch driver shown in FIG. 4.

Turning to FIG. 9, although only one redundant driver circuit 510 is shown, the redundant main switch driver 500 includes a plurality of redundant driver circuits 510. Each of the redundant driver circuits 510 has the same circuit configuration as that of the driver circuits 410 mentioned above and additionally has a transistor 519. The control signal RRMSWT is input to a gate electrode of the transistor 519. With this configuration, a redundant main control signal RMSWB has a low level not only when corresponding one of the predecode signals RFSMT and corresponding ones of the control signals RMSWT and RAAAT are all activated but also when the corresponding control signals RRMSWT and RAAAT are activated. Other operations are the same as those of the driver circuits 410 shown in FIG. 8.

The redundant driver circuits 510 are not dedicated for the replacement operation but are used also at the time of a normal operation. For example, when a predecode signal RFSMT<k> and a control signal RMSWT<n> are activated, the redundant driver circuit 510 shown in FIG. 9 activates a redundant main control signal RMSWB(n, k) even when the control signal RRMSWT is deactivated.

Figure 10:
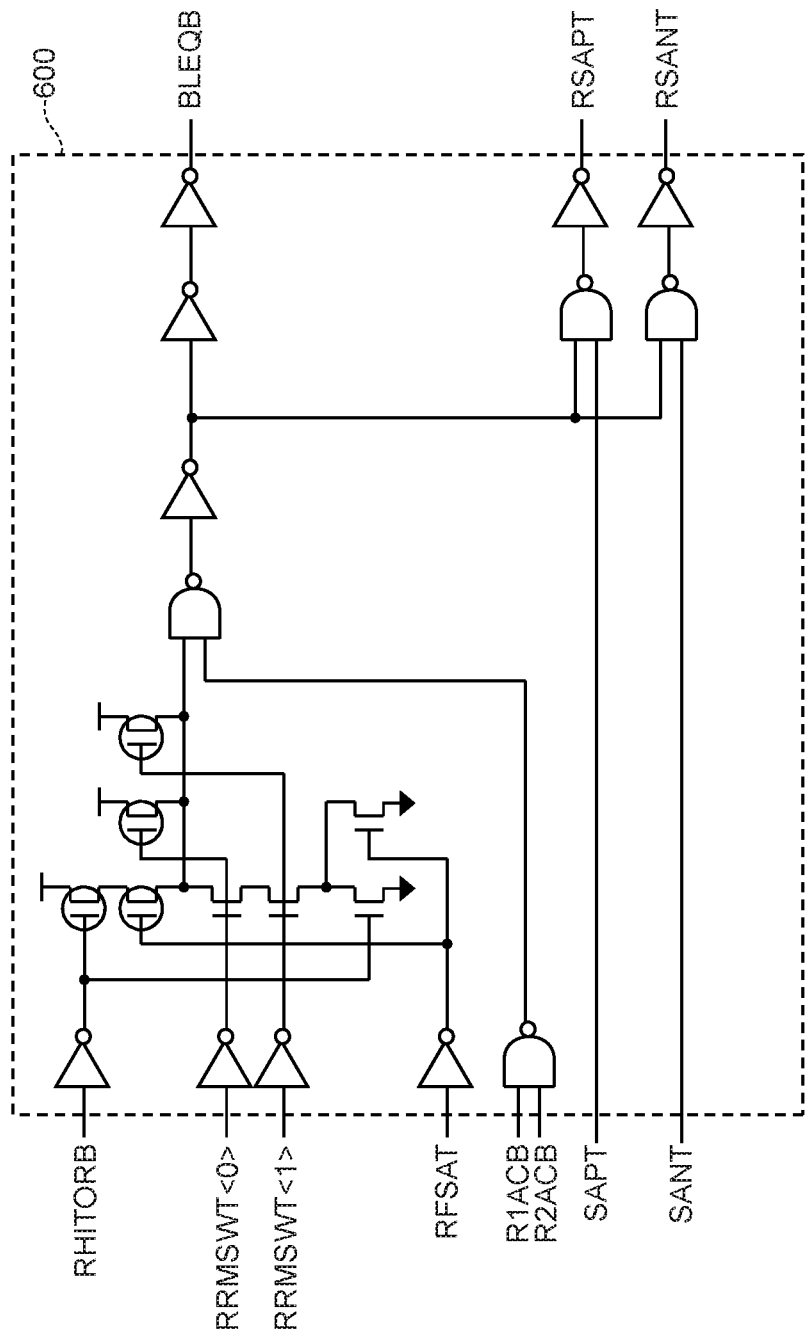
FIG. 10 is a circuit diagram of a sense-amplifier control circuit shown in FIG. 4.

Turning to FIG. 10, the sense-amplifier control circuit 600 generates the equalizing signal BLEQB and the sense-amplifier drive signals RSAPT and RSANT based on various input signals. The equalizing signal BLEQB is for short-circuiting paired global bit lines GBL connected to the same sense amplifier SA and is activated when the timing signals R1ACB and R2ACB are both at a high level. The equalizing signal BLEQB is activated also when the control signals RRMSWT are all at a low level and the hit signal RHITORB or the predecode signal RFSAT is at a low level.

The sense-amplifier drive signals RSAPT and RSANT are both for activating the sense amplifiers SA. The sense-amplifier drive signals RSAPT and RSANT are activated synchronously with the timing signals SAPT and SANT when the equalizing signal BLEQB is deactivated.

Figure 11:
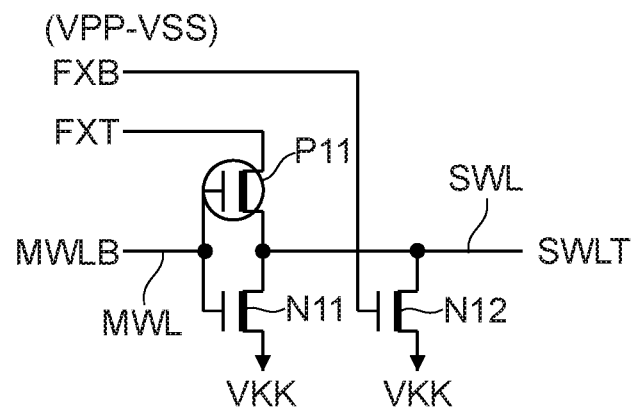
FIG. 11 is a circuit diagram indicative of a sub-word driver shown in FIG. 3.

Turning to FIG. 11, the sub-word driver SWD includes a P-channel MOS transistor P11 and N-channel MOS transistors N11 and N12 all having drains connected to the sub-word line SWL. A negative potential VKK is supplied to sources of the transistors N11 and N12. As shown in FIG. 11, a signal FXT is supplied to a source of the transistor P11 and a signal FXB is supplied to a gate electrode of the transistor N12. The signals FXT and FXB are composed of complementary signals. The main word signal MWLB is supplied to gate electrodes of the transistors P11 and N11 via the main word line MWL.

With this configuration, when the main word signal MWLB is activated to a low level and the signals FXT and FXB are activated to high and low levels, respectively, the sub-word line SWL is driven to the level of the signal FXT (the boosted potential VPP). On the other hand, when the main word signal MWLB is deactivated to a high level or when the signals FXT and FXB are deactivated to low and high levels, respectively, the sub-word line SWL is reset to the negative potential VKK.

Figure 12:
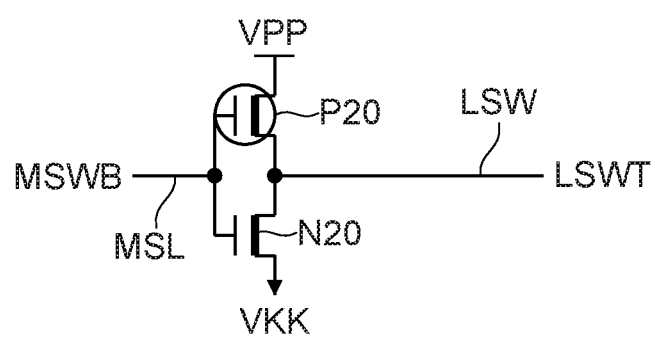
FIG. 12 is a circuit diagram of a local switch driver LSD shown in FIG. 3.

Turning to FIG. 12, each of the local switch drivers LSD is an inverter circuit including transistors P20 and N20. With this circuit configuration, when the main control signal MSWB is activated to a low level, a local control signal LSWT is activated to the VPP level. Alternatively, when the main control signal MSWB is at a high level, the local control signal LSWT is deactivated to a VKK level.

As shown in FIG. 3, each of the main control signal lines MSW is connected to corresponding ones of the local switch drivers LSD. Accordingly, when predetermined one of the main control signals MSWB is activated, the local switch drivers LSD connected to the corresponding main control signal line MSW are all activated, which turns on all of the corresponding hierarchy switches SW.

Operations performed by the semiconductor device according to the present embodiment are explained next with reference to FIGS. 13 and 14.

Figure 13:
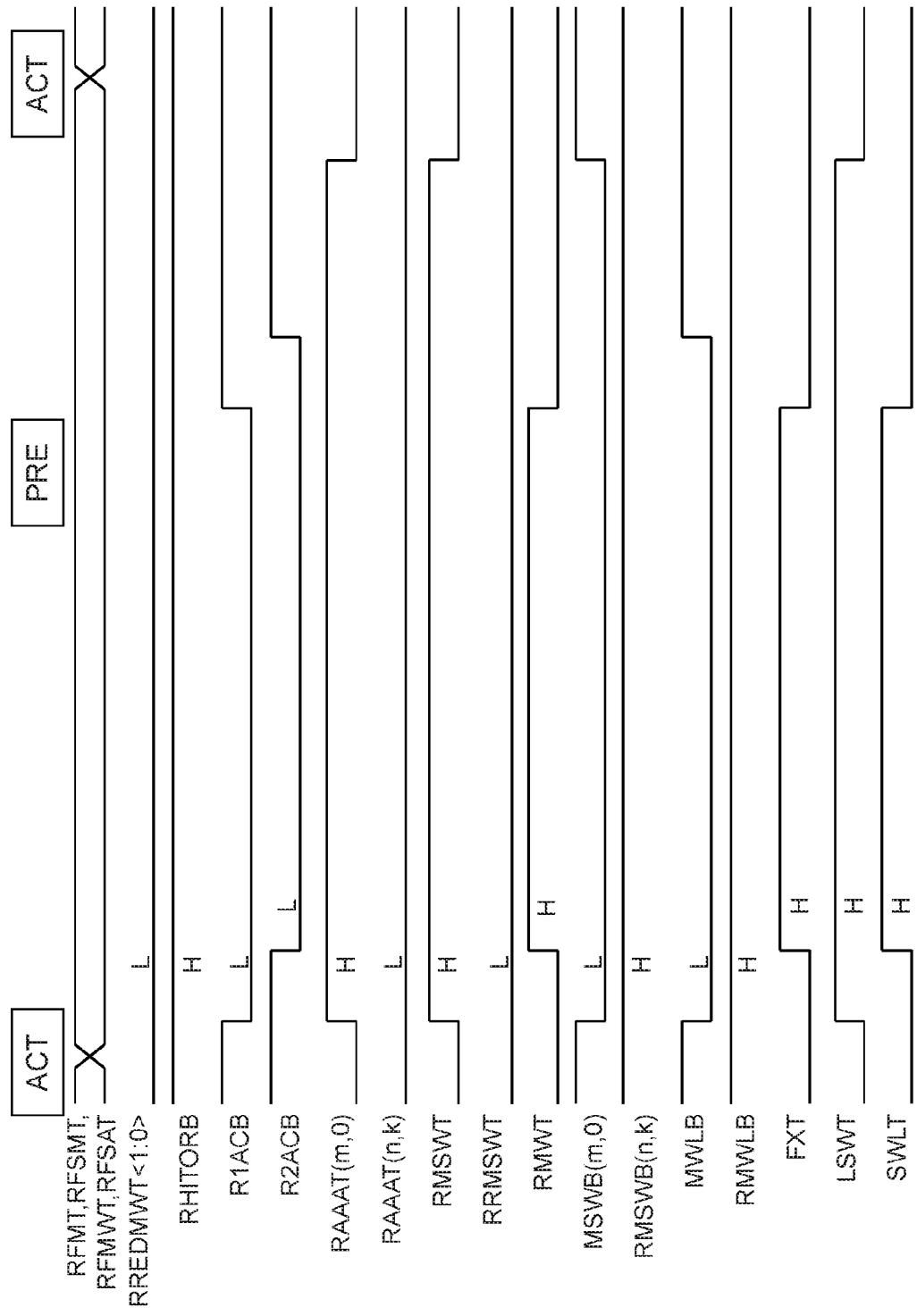
FIG. 13 is a timing chart for explaining an operation in a case where a row address RA to which an access is requested indicates a normal sub-word line SWL, that is, at the time of a mishit.

FIG. 13 shows an operation performed when the sub-word line SWLa shown in FIG. 2 is a normal sub-word line SWL and an access to the sub-word line SWLa is requested. The sub-word line SWLa belongs to the memory sub-mat SMAT<0> in the memory mat MAT<m>.

When the active command ACT is issued first, the timing signals R1ACB and R2ACB change in a predetermined order. When a given row address RA is input synchronously with the active command ACT, the control signals RMWT, RMSWT, and RAAAT corresponding to the row address RA are activated synchronously with changes in the timing signals R1ACB and R2ACB. In an example shown in FIG. 13, the hit signal RHITORB remains deactivated to a high level and the replacement address signal RREDMWT is also kept deactivated. The redundant control signal RRMSWT is also kept deactivated.

Accordingly, the corresponding main-word signal MWLB(m, 0, 0) is activated and also the corresponding main control signal MSWB(m, 0) is activated. As a result, predetermined one of the sub-word lines SWL belonging to the memory sub-mat SMAT<0> in the memory mat MAT<m> is selected and the hierarchy switches SW corresponding to the memory sub-mat SMAT<0> in the memory mat MAT<m> are brought into conduction. Accordingly, data read from a memory cell MC to the corresponding local bit line LBL is transferred to the corresponding global bit line GBL via the corresponding hierarchy switch SW. Although not shown, the sense-amplifier drive signals RSAPT and RSANT are then activated, thereby amplifying a potential difference appearing between the corresponding paired global bit lines GBL.

When the precharge command PRE is then issued, the timing signals R1ACB and R2ACB are returned to the initial state in a predetermined order and, synchronously therewith, the control signals RMWT, RMSWT, and RAAAT are also returned to the initial state. As a result, the sub-word line SWL is deactivated and the hierarchy switches SW are also brought into non-conduction.

Figure 14:
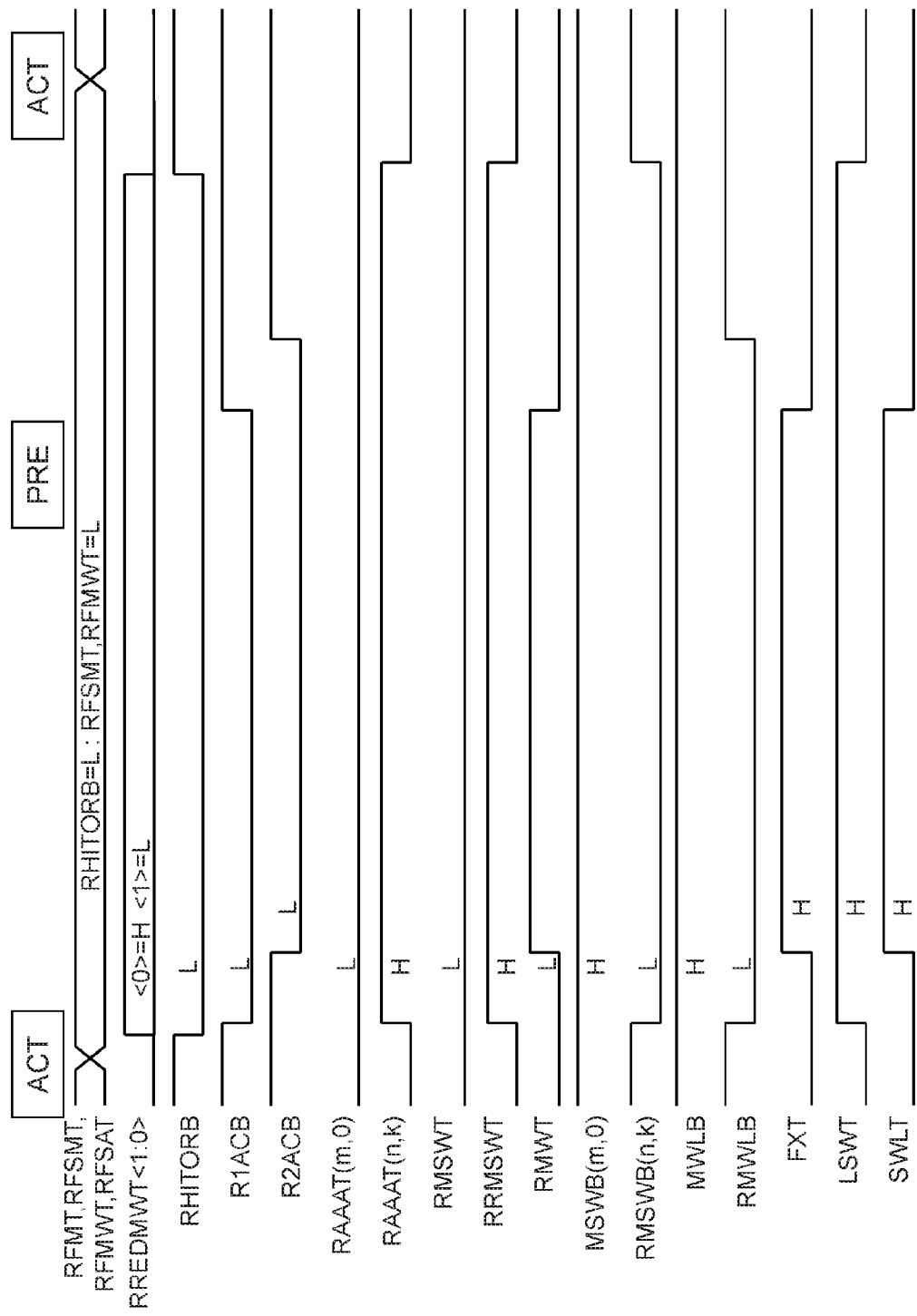
FIG. 14 is a timing chart for explaining an operation in a case where a row address RA to which an access is requested indicates a defective sub-word line SWL, that is, at the time of a hit.

FIG. 14 shows an operation performed when the sub-word line SWLa shown in FIG. 2 is a defective sub-word line and an access to the sub-word line SWLa is requested. A replacement of the sub-word line SWLa is the sub-word line SWLb shown in FIG. 2.

In an example shown in FIG. 14, when a given row address RA is input synchronously with the active command ACT, the hit signal RHITORB is activated to a low level and the replacement address signal RREDMWT<0> is activated to a high level. This activates the corresponding control signals RRMSWT and RAAAT synchronously with changes in the timing signals R1ACB and R2ACB.

Accordingly, the corresponding redundant main-word signal RMWLB(n, k, R0) is activated and also the corresponding redundant main control signal RMSWB(n, k) is activated. As a result, the redundant sub-word line SWL belonging to the memory sub-mat SMAT<k> in the memory mat MAT<n> is selected and the hierarchy switches SW corresponding to the memory sub-mat SMAT<k> in the memory mat MAT<n> are brought into conduction. That is, predetermined one of the sub-word lines SWL belonging to the memory sub-mat SMAT<0> in the memory mat MAT<m> is replaced with the redundant sub-word line SWL belonging to the memory sub-mat SMAT<k> in the memory mat MAT<n> and also the hierarchy switches SW to be brought into conduction are switched. In this way, data read from a replacement memory cell MC to the corresponding local bit line LBL is correctly transferred to the corresponding global bit line GBL via the corresponding hierarchy switch SW.

As described above, in the present embodiment, when a row address RA indicating a defective sub-word line SWL is input, the memory mat MAT<n> different from the memory mat MAT<m> to which the defective sub-word line SWL belongs can be selected as a replacement. Accordingly, the need to provide a redundant sub-word line SWL in each memory sub-mat is eliminated and thus the chip area can be reduced. Furthermore, even when many defective sub-word lines SWL occur in one memory sub-mat, these sub-word lines can be relieved, and therefore relieving efficiency can be enhanced.

A second embodiment of the present invention is explained next.

When an open bit-line architecture is adopted in a semiconductor device having hierarchized bit lines, sensing sensitivity can be enhanced not only by turning on the hierarchy switches SW in a memory mat to which an access is requested (an access-side memory mat) but also by turning on the hierarchy switches SW in a memory mat (a reference-side memory mat) lying side by side across the corresponding sense amplifier SA as described in Japanese Patent Application Laid-open No. 2011-34614. In this case, the hierarchy switches SW in the reference-side memory mat that are located symmetrically to the hierarchy switches SW to be turned on in the access-side memory mat with respect to the corresponding sense amplifier SA are preferably selected as the hierarchy switches SW to be turned on. In the reference-side memory mat, the sub-word lines SWL need to be kept deactivated. This enables parasitic CR models on the access side and on the reference side to be substantially matched, so that high sensing sensitivity can be secured even when the wiring length of the global bit lines GBL is long.

Figure 15A:
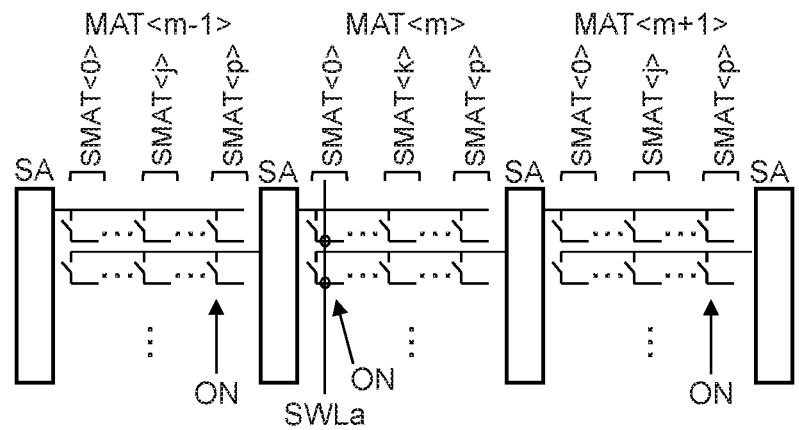
FIG. 15A is a schematic diagram for explaining which hierarchy switch SW in each reference-side memory mat is selected, when a sub word line SWLa is selected.

To realize this control, it suffices to perform address allocation in the main switch driver 400 to turn on also the hierarchy switches SW in the reference-side memory mat each time an access is requested. In a memory cell array having an open bit-line architecture, except when a memory mat on an end (an end mat) is selected, two memory mats lying next to a selected memory mat on opposite sides are the reference-side memory mats as shown in FIG. 15A. In an example shown in FIG. 15A, a memory mat MAT<m> is an access-side memory mat and memory mats MAT<m−1> and MAT<m+1> on opposite sides of the memory mat MAT<m> are the reference-side memory mats. Because the leftmost memory sub-mat SMAT<0> included in the memory mat MAT<m> is selected, the rightmost memory sub-mat SMAT<p> is selected in each of the memory mats MAT<m−1> and MAT<m+1>, thereby maintaining symmetry. At that time, it is necessary to deactivate all sub-word lines SWL included in the memory sub-mats SMAT<p> of the memory mats MAT<m−1> and MAT<m+1>.

Figure 15B:
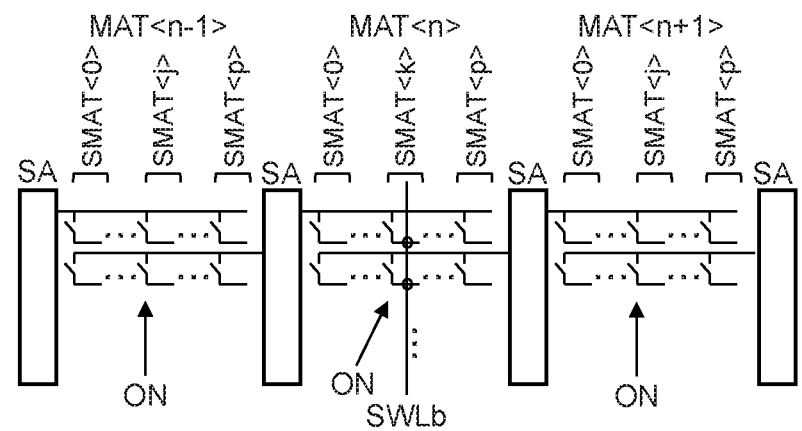
FIG. 15B is a schematic diagram for explaining which hierarchy switch SW in each reference-side memory mat is selected, when a sub word line SWLb is selected.

Meanwhile, when a row address RA to which an access is requested indicates a defective sub-word line SWL, a redundant sub-word line SWL as a replacement may belong to a different memory mat MAT in the second embodiment. Accordingly, the circuit configuration of the main switch driver 400 needs to be partially changed to turn on the hierarchy switches SW in the reference-side memory mats also at the replacement operation. For example, a case where a sub-word line SWLa shown in FIG. 15A is a defective sub-word line SWL and is replaced with a redundant sub-word line SWLb shown in FIG. 15B is considered. When the redundant sub-word line SWLb as a replacement belongs to a memory mat MAT<n>, memory mats MAT<n−1> and MAT<n+1> on the opposite sides of the memory mat MAT<n> need to be selected as reference-side memory mats. Because a memory sub-mat SMAT<k> included in the memory mat MAT<n> is selected, a symmetrically located memory sub-mat SMAT<j> is selected in each of the memory mats MAT<n−1> and MAT<n+1>. At that time, all sub-word lines SWL included in the memory sub-mats SMAT<j> of the memory mats MAT<n−1> and MAT<n+1> need to be deactivated.

Figure 16:
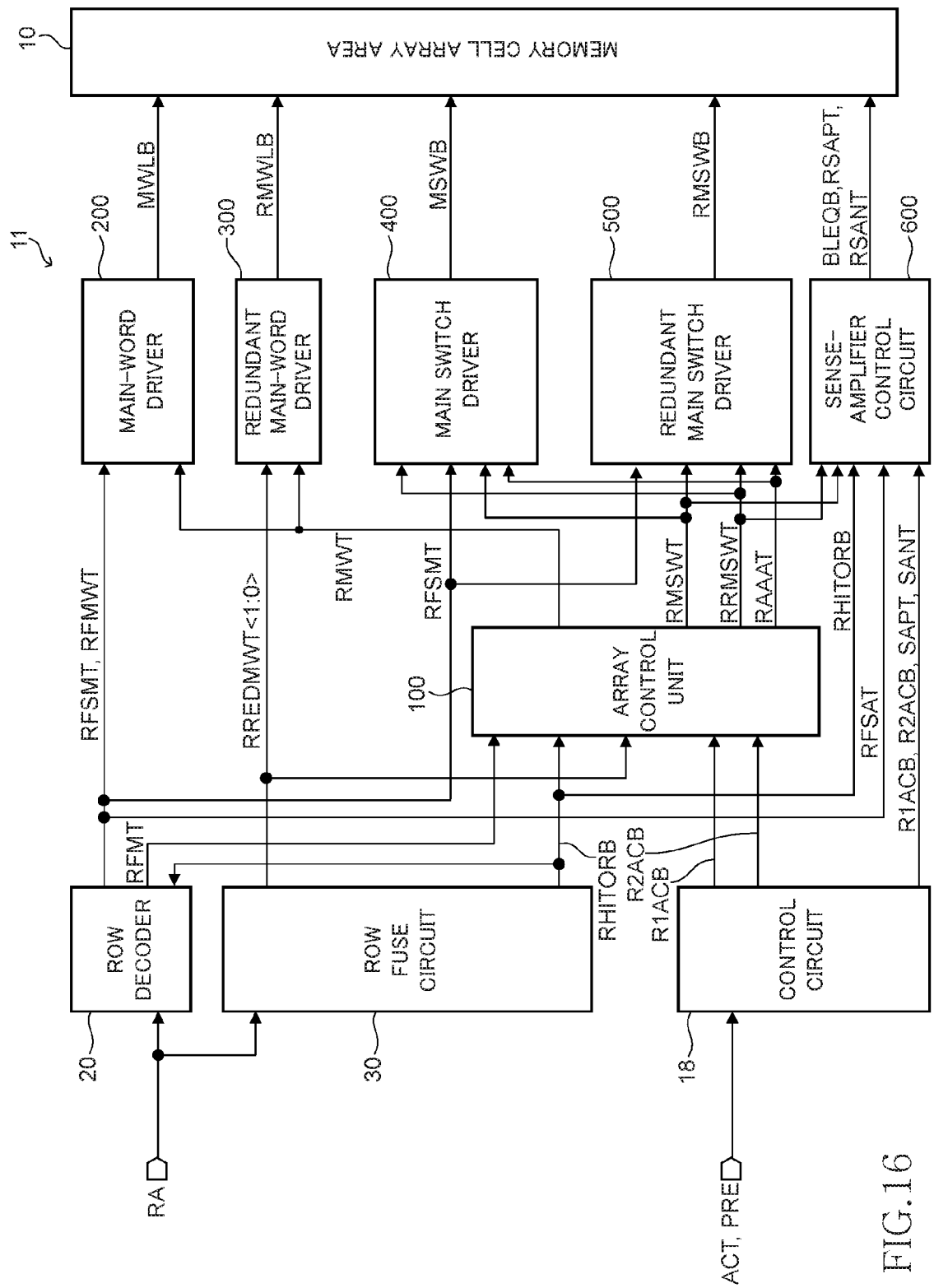
FIG. 16 is a block diagram showing a circuit configuration of a row control circuit according to a second embodiment of the present invention.

Turning to FIG. 16, the second embodiment is different from the first embodiment shown in FIG. 4 in that the redundant control signal RRMSWT is supplied to the main switch driver 400. Because other points are identical to those of the first embodiment shown in FIG. 4, like elements are denoted by like reference characters and redundant explanations thereof will be omitted.

Figure 17:
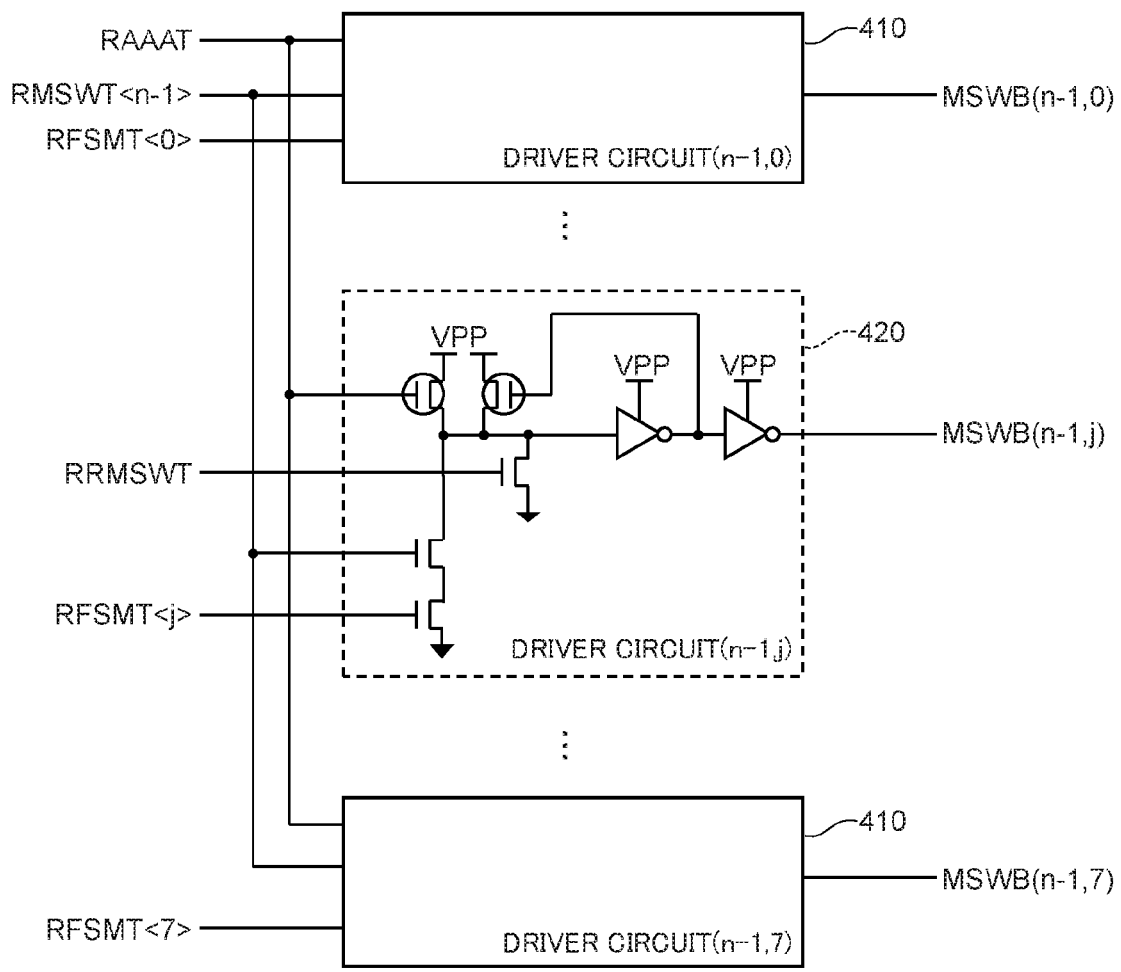
FIG. 17 is a circuit diagram of a main switch driver shown in FIG. 16.

Turning to FIG. 17, the main switch driver 400 according to the second embodiment includes the driver circuits 410 and a plurality of driver circuits 420 in a mixed manner. Each of the driver circuits 420 has the same circuit configuration as that of the redundant driver circuit 510 shown in FIG. 9 and therefore activates the main control signal MSWB to a low level not only when corresponding one of the predecode signals RFSMT and corresponding ones of the control signals RMSWT and RAAAT are all activated but also when corresponding ones of the control signals RRMSWT and RAAAT are activated.

With this configuration, at the time of a hit, the redundant main control signal RMSWB(n, k) is activated by the redundant main switch driver 500 and also main control signals MSWB(n−1, j) and MSWB(n+1, j) are activated by the main switch driver 400.

As described above, according to the second embodiment, the effect of the first embodiment mentioned above is achieved and also high sensing sensitivity can be secured also at the time of the replacement operation because the parasitic CR models on the access side and on the reference side are substantially matched.

It is apparent that the present invention is not limited to the above embodiments, but may be modified and changed without departing from the scope and spirit of the invention.

What is claimed is:

1. A method for accessing a semiconductor memory device having hierarchically structured bit lines comprising:
receiving address information;
determining whether the address information corresponds to stored defective address information; and
if the address information does not correspond to the stored defective address information:
activating a first word line corresponding to the address information in a first memory mat,
activating a plurality of local switches to connect a plurality of local bit lines to a plurality of global bit lines in the first memory mat, and
activating a plurality of sense amplifiers connected to the global bit lines in the first memory mat;
if the address information corresponds to the stored defective address information:
activating a redundant word line in a second memory mat,
activating a plurality of local switches to connect a plurality of local bit lines to a plurality of global bit lines in the second memory mat, and
activating a plurality of sense amplifiers connected to the global bit lines in the second memory mat.

2. The method as claimed in claim 1 wherein the defective address information is stored in fuses.

3. The method as claimed in claim 1 wherein the first word line and the redundant word line are a first sub-word line and a redundant sub-word line.

4. The method as claimed in claim 1 wherein the first memory mat does not include a redundant word line.

5. The method as claimed in claim 1 wherein the first and second memory mats have an open bit line structure.

6. The method as claimed in claim 1 wherein a pair of global bit lines is connected to each sense amplifier.

7. The method as claimed in claim 6 wherein a first global bit line of the pair of global bit lines is located in the first and second memory mats and a second global bit line of the pair of global bit lines is located in memory mats adjacent to the first and second memory mats.

8. The method as claimed in claim 1 wherein the semiconductor memory device is a DRAM.

9. The method as claimed in claim 1 further comprising:
if the address information does not correspond to the stored defective address information:
activating a plurality of local switches to connect a plurality of local bit lines to a plurality of global bit lines in a third memory mat adjacent to the first memory mat, and
activating a plurality of local switches to connect a plurality of local bit lines to a plurality of global bit lines in a fourth memory mat adjacent to the first memory mat and opposite the third memory mat; and
if the address information corresponds to the stored defective address information:
activating a plurality of local switches to connect a plurality of local bit lines to a plurality of global bit lines in a fifth memory mat adjacent to the second memory mat, and
activating a plurality of local switches to connect a plurality of local bit lines to a plurality of global bit lines in a sixth memory mat adjacent to the second memory mat and opposite the fifth memory mat.

10. The method as claimed in claim 9 wherein the local switches in the third and fourth memory mats are located symmetrically with respect to the sense amplifiers connected to the global bit lines in the first memory mat and the local switches in the fifth and sixth memory mats are located symmetrically with respect to the sense amplifiers connected to the global bit lines in the second memory mat.

* * * * *